United States Patent
Horiguchi

(10) Patent No.: US 8,663,430 B2
(45) Date of Patent: Mar. 4, 2014

(54) MAGNETRON SPUTTERING APPARATUS AND METHOD FOR MANUFACTURING THIN FILM

(75) Inventor: Seishi Horiguchi, Niiza (JP)

(73) Assignee: Canon Anelva Corporation, Kawasaki-shi (JP)

( * ) Notice: Subject to any disclaimer, the term of this patent is extended or adjusted under 35 U.S.C. 154(b) by 578 days.

(21) Appl. No.: 12/468,222

(22) Filed: May 19, 2009

(65) Prior Publication Data

US 2010/0133089 A1 Jun. 3, 2010

(30) Foreign Application Priority Data

May 22, 2008 (JP) ................................ 2008-133795

(51) Int. Cl.
*C23C 14/35* (2006.01)
(52) U.S. Cl.
USPC ............ 204/192.12; 204/192.17; 204/298.08; 204/298.19
(58) Field of Classification Search
USPC ............. 204/192.12, 192.17, 298.16, 298.19, 204/298.2, 298.08
See application file for complete search history.

(56) References Cited

U.S. PATENT DOCUMENTS

| | | | | |
|---|---|---|---|---|
| 4,622,122 A | * | 11/1986 | Landau | 204/298.19 |
| 6,074,538 A | * | 6/2000 | Ohmi et al. | 204/298.06 |
| 2003/0029567 A1 | * | 2/2003 | Dhindsa et al. | 156/345.47 |
| 2009/0260976 A1 | * | 10/2009 | Nakamura | 204/192.15 |
| 2009/0277781 A1 | * | 11/2009 | Nakamura et al. | 204/192.15 |
| 2010/0187093 A1 | * | 7/2010 | Kuribayashi | 204/192.1 |

FOREIGN PATENT DOCUMENTS

| | | |
|---|---|---|
| JP | 01-286228 | 11/1989 |
| JP | 03-101033 | 4/1991 |
| JP | 03-232959 | 10/1991 |
| JP | 09-272973 | 10/1997 |

OTHER PUBLICATIONS

Machine Translation of JP 09-272973 dated Oct. 21, 1997.*
Chinese office action issued in corresponding application No. 200910202958.8, dated Nov. 29, 2010, along with its English-language translation—12 pages.

* cited by examiner

*Primary Examiner* — Rodney McDonald
(74) *Attorney, Agent, or Firm* — Fitzpatrick, Cella, Harper & Scinto

(57) ABSTRACT

In the present invention, in forming a $LaB_6$ thin film by magnetron sputtering, the single-crystal properties in the wide domain direction in the obtained $LaB_6$ thin film are improved. In one embodiment of the present invention, in a magnetron sputtering apparatus, parallel magnetic field strength on a surface of the substrate is set to 0.1 times or less parallel magnetic field strength on a surface of the target.

8 Claims, 6 Drawing Sheets

MAGNETRON SPUTTERING APPARATUS AND METHOD FOR MANUFACTURING THIN FILM

CROSS-REFERENCES TO RELATED APPLICATIONS

This application claims the benefit of priority from Japanese Patent Application No. 2008-133795 filed May 22, 2008, the entire contents of which is incorporated herein by reference.

BACKGROUND OF THE INVENTION

1. Field of the Invention

The present invention relates to an apparatus for manufacturing a thin film of a lanthanide compound containing at least one element selected from light elements and at least one element selected from lanthanide elements, particularly, a boron-lanthanum compound containing boron and lanthanum, and a method for manufacturing the thin film.

2. Related Background Art

A thin film of a boron-lanthanum compound, such as $LaB_6$, is known as a electron generating film using a lanthanide-based compound, as described in Japanese Patent Application Laid-Open No. H1-286228, Japanese Patent Application Laid-Open No. H3-232959, and Japanese Patent Application Laid-Open No. H3-101033.

Also, in conventional inventions described in Japanese Patent Application Laid-Open No. H1-286228, Japanese Patent Application Laid-Open No. H3-232959, and Japanese Patent Application Laid-Open No. H3-101033, a crystalline thin film of a boron-lanthanum compound is formed using a sputtering method.

However, when a thin film of a lanthanide-based compound formed by a conventional sputtering apparatus and sputtering method is applied to a electron source film, the electron generation efficiency of the electron source film is insufficient.

Particularly, when a thin film of a boron-lanthanum compound, such as $LaB_6$, is used in an FED (Field Emission Display) or an SED (Surface-Conduction Electron-Emitter Display), sufficient brightness as a display is not obtained in the actual state.

SUMMARY OF THE INVENTION

According to the study of the present inventor, the above problems are caused by the fact that the crystal growth of the thin film of a boron-lanthanum compound is not uniformly performed over the entire surface of the substrate. Particularly, with a very thin film thickness, such as 10 nm or less, sufficiently wide single-crystal domains are not formed over the entire surface of the substrate.

Also, according to the study of the present inventor, it has been found that an improvement in homogeneity on the entire surface of a substrate in the wide single-crystal domains can significantly improve the electron generation efficiency, and can lead to an improvement in brightness, particularly in an electron generating apparatus, such as an FED or an SED. The improvement in brightness leads to a reduction in the voltage of the anode of the FED or the SED, and simultaneously leads to the enlargement of the usable range or selection range of phosphors that can be used.

It is an object of the present invention to provide a manufacturing apparatus that can form a film with uniform wide single-crystal domains over the entire surface of a substrate in forming a thin film of a lanthanide compound, for example, a boron-lanthanum compound, such as $LaB_6$, and a method for manufacturing the same.

The first aspect of the present invention is magnetron sputtering apparatus comprising: a substrate holder that can hold a substrate; and a magnetron cathode having a cathode on which a target can be mounted, and a magnetic field generating apparatus, wherein parallel magnetic field strength (in gauss) on a surface of the substrate is set to 0.1 times or less parallel magnetic field strength (in gauss) on a surface of the target.

The second aspect of the present invention is a method for manufacturing a thin film, comprising the steps of: preparing a substrate; and depositing a thin film of a lanthanide compound containing at least one element selected from light elements and at least one element selected from lanthanide elements on the substrate by a magnetron sputtering method using a target of the lanthanide compound, wherein parallel magnetic field strength (in gauss) on a surface of the substrate is set to 0.1 times or less parallel magnetic field strength (in gauss) on a surface of the target.

According to the present invention, the electron generation efficiency of the thin film of a lanthanide-based compound, such as $LaB_6$, is improved. Also, according to the present invention, the brightness of an FED and SED display is improved.

DESCRIPTION OF THE PREFERRED EMBODIMENTS

Figure 1:
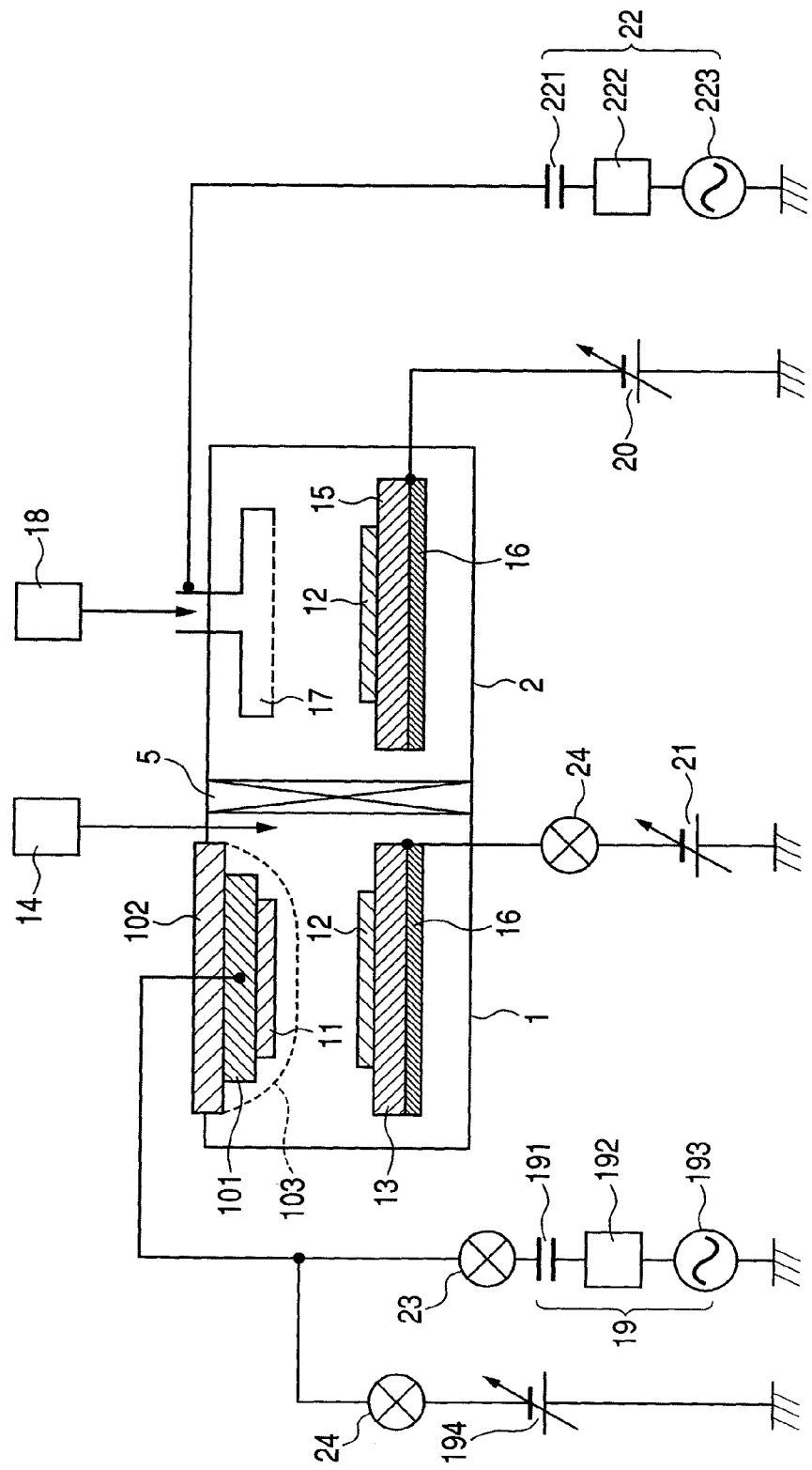
FIG. 1 is a cross-sectional view of a magnetron sputtering apparatus showing the first embodiment of the present invention.

FIG. 1 is a schematic view of an apparatus according to the first embodiment of the present invention. Reference numeral 1 denotes a first container, reference numeral 2 denotes a second container (annealing unit) vacuum-connected to the first container 1, and reference numeral 5 denotes a gate valve. Reference numeral 11 denotes a target, reference numeral 12 denotes a substrate, reference numeral 13 denotes a substrate holder (first substrate holder) that can hold the substrate 12, and reference numeral denotes a sputtering gas introducing system. Reference numeral 15 denotes a substrate holder (second substrate holder), reference numeral 16 denotes a heating mechanism, reference numeral 17 denotes a plasma electrode, and reference numeral 18 denotes a gas introducing system for a plasma source. Reference numeral 19 denotes a high frequency power supply system for sputtering, reference numeral 101 denotes a cathode to which the target 11 formed by a boron-lanthanum compound containing boron and lanthanum can be mounted, reference numeral 102 denotes a magnetic field generating apparatus (magnets), reference numeral 103 denotes a magnetic field region, reference numeral 191 denotes a blocking capacitor, reference numeral 192 denotes a matching circuit, reference numeral 193 denotes a high frequency power supply, and reference numeral 194 denotes a bias power supply for sputtering. Reference numeral 20 denotes a substrate bias power supply (for annealing) (third direct current power supply), reference numeral 21 denotes a substrate bias power supply (second direct current power supply), reference numeral 22 denotes a high frequency power supply system for a plasma source, reference numeral 221 denotes a blocking capacitor, reference numeral 222 denotes a matching circuit, and reference numeral 223 denotes a high frequency power supply. Reference numeral 23 denotes a low frequency cut filter (filter) that cuts low frequency components from the high frequency power supply 193 to provide high frequency component power. Reference numeral 24 denotes a high frequency cut filter that cuts high frequency components (high frequency components of, for example, 1 KHz or more, particularly 1 MHz) included in direct current power from the direct current power supplies 21 and 194.

The apparatus of the present invention is suitable when the target 11 containing a lanthanide compound containing at least one element selected from light elements and at least one element selected from lanthanide elements is used. As the light element, at least one selected from the group consisting of lithium, beryllium, boron, carbon, fluorine, sodium, magnesium, phosphorus, and sulfur can be used.

Specific examples of the above lanthanide compound can include $LaB_6$, $CeB_6$, $La_2O_3$, and the like. Also, the target 11 preferably includes a boron-lanthanum compound containing boron and lanthanum, optimally $LaB_6$.

The substrate 12 is placed on the holder 13 in the first container 1 and opposed to the cathode 101, and evacuation and heating (the temperature is raised to a temperature at the time of subsequent sputtering) in the container are performed. Heating is carried out by the heating mechanism 16. Then, a sputtering gas (a helium gas, an argon gas, a krypton gas, or a xenon gas) is introduced by the sputtering gas introducing system 14 at a predetermined pressure (0.01 Pa to 50 Pa, preferably 0.1 Pa to 10 Pa), and then, film formation (deposition) is started using the sputtering power supply 19.

Then, high frequency power (the frequency is 0.1 MHz to 10 GHz, preferably 1 MHz to 5 GHz, and the input power is 100 watts to 3000 watts, preferably 200 watts to 2000 watts) is applied from the high frequency power supply 193 to produce a plasma, and direct current power (voltage) is set at a predetermined voltage (−50 volts to −1000 volts, preferably −10 volts to −500 volts) in the first direct current power supply 194 so as to perform sputtering film formation. On the substrate 12 side, direct current power (voltage) is applied at a predetermined voltage (0 volts to −500 volts, preferably −10 volts to −100 volts) to the substrate holder 13 by the second direct current power supply 21. The direct current power from the first direct current power supply 194 (first direct current power) may be input before the application of the high frequency power from the high frequency power supply 193, may be input simultaneously with the application of the high frequency power, or may be continuously input also after the completion of the application of the high frequency power.

The positions where the direct current power and/or high frequency power from the above second direct current power supply 21 and/or high frequency power supply for sputtering 19 are input to the cathode 11 are preferably a plurality of points symmetric with respect to the central point of the cathode 11. For example, positions symmetric with respect to the central point of the cathode 11 can be a plurality of positions where the direct current power and/or high frequency power are input.

The magnetic field generating means 102 provided with permanent magnets or electromagnets is located, positioned behind the cathode 101, and a surface of the target 11 can be exposed to the magnetic field 103. Also, desirably, the magnetic field 103 does not reach a surface of the substrate 12, but the magnetic field 103 may reach the surface of the substrate 12 to the extent of not narrowing the wide single-crystal domains of the boron-lanthanum compound film.

The high frequency cut filter 24 provided on the first direct current power supply 194 side used in the present invention can protect the first direct current power supply 194, as another effect.

The south pole and north pole of the magnetic field generating means 102 can be located with polarities opposite to each other in the direction vertical to the plane of the cathode 103. At this time, neighboring magnets have polarities opposite to each other in the direction horizontal to the plane of the cathode 103. Also, the south pole and north pole of the magnetic field generating means 102 can be located with polarities opposite to each other in the direction horizontal to the plane of the cathode 103. Also at this time, neighboring magnets have polarities opposite to each other in the direction horizontal to the plane of the cathode 103.

Figure 2:
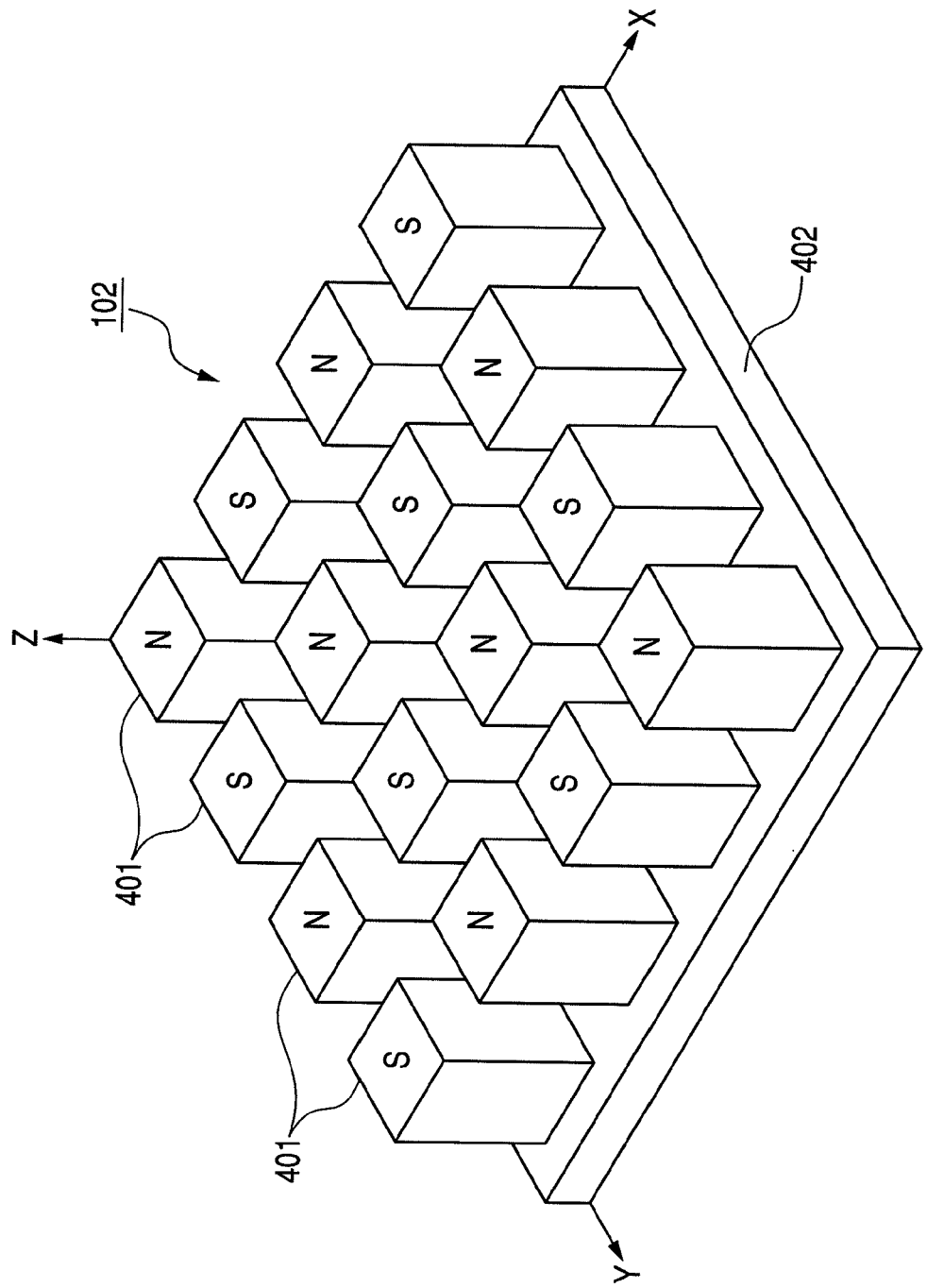
FIG. 2 is a perspective view of a magnet used in the present invention.

FIG. 2 is a perspective view of the magnetic field generating means 102 used in the present invention.

The magnetic field generating means 102 has a sub-magnet array structure in which a plurality of sub-magnets 401 are located on a yoke substrate 402 along rows (X-direction) and columns (Y-direction).

For the magnetic field region 103 generated by the magnetic field generating means 102, the parallel magnetic field strength on a surface of the target 11 is preferably set to 200 gauss or more, desirably 300 gauss to 1000 gauss, particularly desirably 500 gauss to 800 gauss, and the parallel magnetic field strength on a surface of the substrate 12 is preferably set to 20 gauss or less, desirably 2 gauss or less. Also, the parallel magnetic field strength (in gauss) on the surface of the substrate 12 is set to 0.1 times or less, desirably 0.01 times or less, the parallel magnetic field strength (in gauss) on the surface of the target 11.

In a preferred aspect of the present invention, the magnetic field generating means 102 can oscillate in the direction horizontal to the plane of the cathode 101 or the surface of the target 11.

The filter 23 used in the present invention can cut low frequency components (frequency components of 0.01 MHz or less, particularly 0.001 MHz or less) from the high frequency power supply 193. Clearly, the size of the single-crystal domains is different between when this filter 23 is used and when this filter 23 is not used. The area of the single-crystal domains when the filter 23 is used is in the range of 1 $\mu m^2$ to 1 $mm^2$, preferably 5 $\mu m^2$ to 500 $\mu m^2$, on average, while the area of the single-crystal domains when the filter 23 is not used is 0.01 $\mu m^2$ to 1 $\mu m^2$ on average.

Further, in the present invention, the average area of the single-crystal domains can be increased by the application of direct current power (voltage) from the second direct current power supply 21 on the substrate 12 side to the substrate holder 13. This second direct current power (voltage) may be pulse waveform power having a direct current component (a direct current component to ground) on a time average.

Further, in the present invention, an increase in the average area of the single-crystal domains can be intended by adding an annealing process.

After the film formation (deposition) by the magnetron sputtering method described above is completed, the substrate 12 is conveyed into the second container via the gate valve 5 without breaking the vacuum, and placed on the holder 15 in the second container 2, and annealing (200° C. to 800° C., preferably 300° C. to 500° C.) is started by the heating mechanism 16. During the annealing period, a predetermined voltage (−10 volts to −1000 volts, preferably −100 volts to −500 volts) may be applied to the substrate 12 by the third direct current power supply 20, while the substrate 12 is exposed to a plasma source gas (argon gas, krypton gas, xenon gas, hydrogen gas, nitrogen gas, or the like) plasma from the gas introducing system for a plasma source 18. After the annealing is completed, the inside of the second container 2 is returned to atmospheric pressure, and the substrate 12 is taken out.

Further, the power supply system for a plasma source 22 comprises a blocking capacitor 221, a matching circuit 222, and a high frequency power supply 223, and high frequency power (the frequency is 0.1 MHz to 10 GHz, preferably 1 MHz to 5 GHz, and the input power is 100 watts to 3000 watts, preferably 200 watts to 2000 watts) can be applied from the high frequency power supply 223.

The substrate holder 15 is heated to a predetermined temperature by the heating mechanism 16, and the substrate 12 placed on the substrate holder 15 is subjected to the annealing treatment. Here, the set temperature of the heating mechanism 16 and the annealing treatment time are adjusted to optimal values according to the required film properties. At this time, it is possible to further enhance the effect of annealing by exposing the substrate 12 to a particle beam of ions, electrons, or radicals (active species). The exposure to a particle beam of ions, electrons, or radicals (active species) can be performed during, after, or before the heating of the above substrate 12.

This embodiment shows an example of a plasma source using a parallel plate type high frequency discharge electrode 17 (plasma electrode 17), but a bucket type ion source, an ECR (electron cyclotron) ion source, an electron beam exposure apparatus, or the like can also be used. Also, at this time, the substrate holder 15 on which the substrate 12 is placed may be at floating potential, but it is also effective to apply a predetermined bias voltage from the third direct current power supply 20 in order that the energy of incident particles is at a constant level. The substrate 12 after the annealing treatment is completed is taken out into the air via a conveyance chamber and a conveyance mechanism, a preparation chamber, and a take-out chamber, not shown. In this apparatus, after the LaB$_6$ thin film is formed, the annealing treatment and the like are performed without taking out the substrate 12 into the air, so that the LaB$_6$ surface is not contaminated by components in the air, and a LaB$_6$ thin film having a good crystal structure can be obtained.

In the present invention, for the deposited LaB$_6$, a stoichiometrical thin film can be formed (deposited) by using a target having a stoichiometric composition.

Also, in another embodiment of the present invention, a non-stoichiometrical thin film can be formed by using a simultaneous sputtering method with a stoichiometrical LaB$_6$ target and a La target.

The LaB$_6$ thin film used in the present invention can also contain other components, for example, Ba metal and the like.

Figure 3:
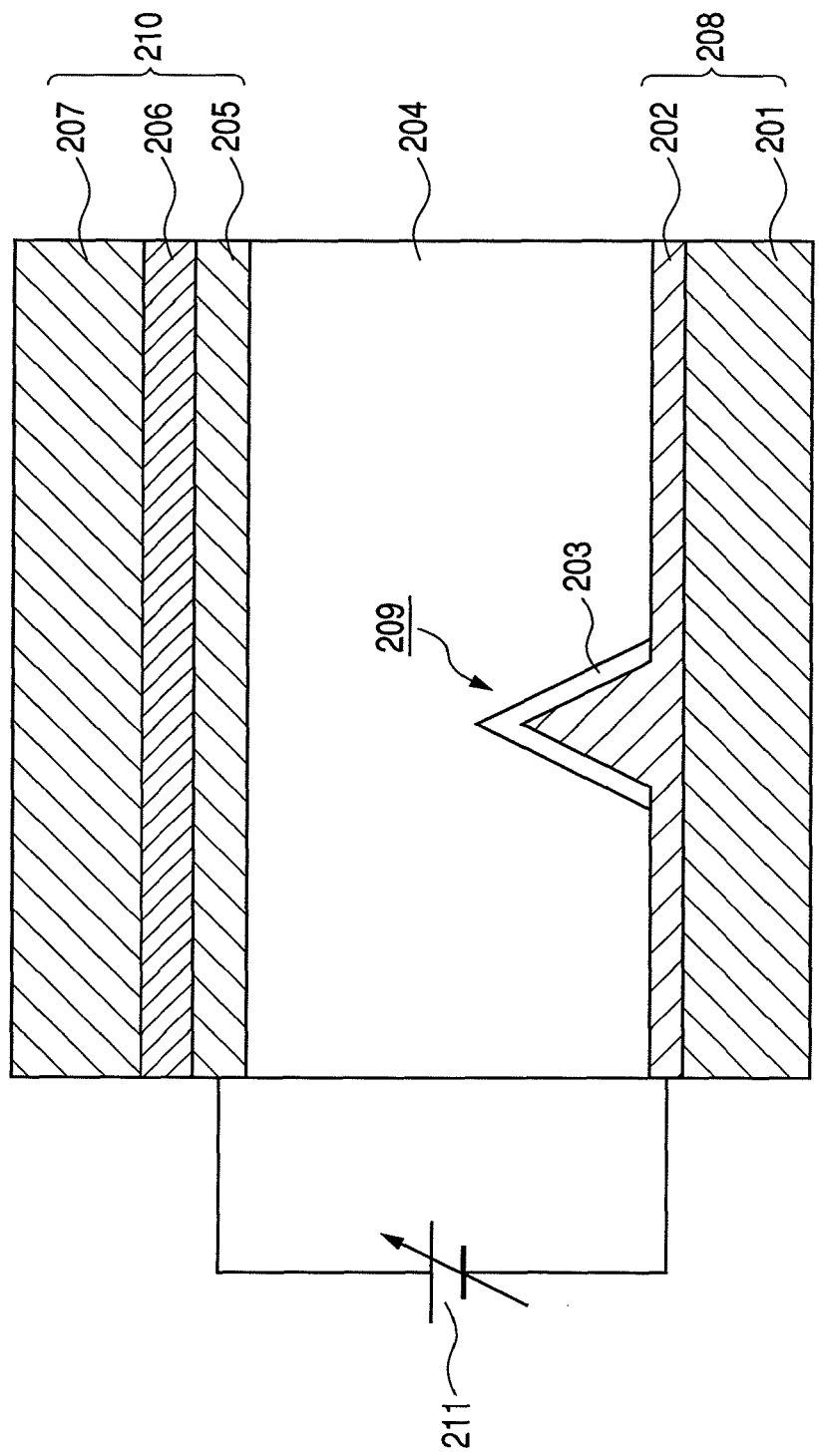
FIG. 3 is a schematic cross-sectional view of the electron generating apparatus of the present invention.

Reference numeral 208 in FIG. 3 denotes an electron source substrate in which a molybdenum film (cathode electrode) 202 in which a conical protrusion 209 is formed, and a LaB$_6$ film 203 covering the protrusion 209 of the molybdenum film are formed. Reference numeral 210 denotes a phosphor substrate including a glass substrate 207, a phosphor film 206 on the glass substrate 207, and an anode electrode 205 made of an aluminum thin film. A space 204 between these electron source substrate 208 and phosphor substrate 210 is a vacuum space. By applying a direct current voltage of 100 volts to 3000 volts between the cathode electrode 202 and the anode electrode 205, an electron beam is emitted from the tip portion of the protrusion 209 of the molybdenum film 202 covered with the LaB$_6$ film 203 toward the anode electrode 205, passes through the anode electrode 205, and impinges on the phosphor film, so that fluorescence can be generated.

Figure 4A:
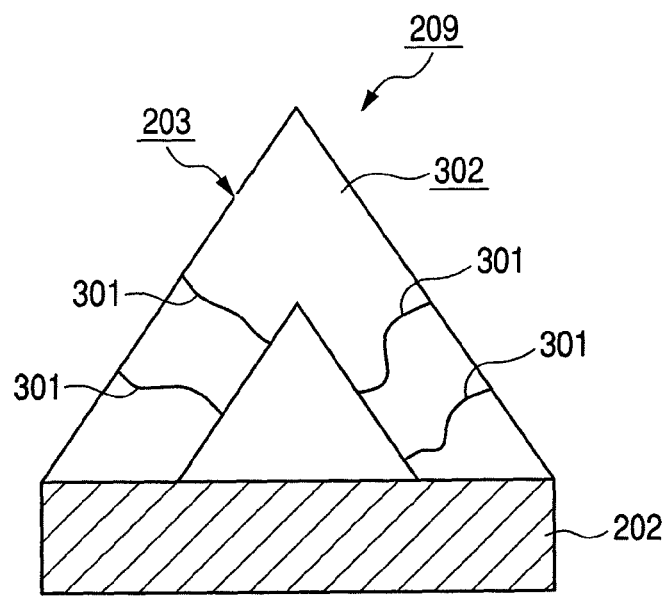
FIG. 4A is an enlarged cross-sectional view of a $LaB_6$ thin film formed by a method according to one embodiment of the present invention.

FIG. 4 is enlarged cross-sectional views of the protrusion 209 covered with the LaB$_6$ film 203 in FIG. 3. The protrusion 209 in FIG. 4A is covered with the LaB$_6$ film 203 formed according to the present invention, and wide single-crystal domains 302 surrounded by grain boundaries 301 are formed in the film. The area of these wide single-crystal domains 302 is in the range of 1 $\mu m^2$ to 1 $mm^2$, preferably 5 $\mu m^2$ to 500 $\mu m^2$, on average.

Figure 4B:
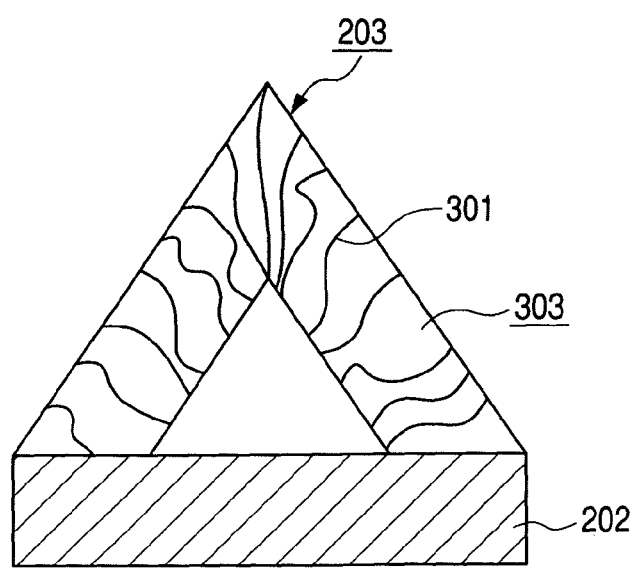
FIG. 4B is an enlarged cross-sectional view of a $LaB_6$ thin film formed by a method that is not one embodiment of the present invention.

The protrusion 209 in FIG. 4B is covered with the LaB$_6$ film 203 formed not according to the present invention, and narrow single-crystal domains 303 are formed in the film. The area of these narrow single-crystal domains 303 is 0.01 $\mu m^2$ to 1 $\mu m^2$ on average.

Next, the electron generating apparatus shown in FIG. 3 was fabricated, and the brightness was visually observed and determined. Brightness that can be sufficiently used for display was produced.

The electron source substrate 208 was fabricated using the steps of forming the molybdenum film 202 having a film thickness of 3 $\mu m$ and having the protrusion 209 having a cone radius of 1 $\mu m$ and a height of 2 $\mu m$ on the glass substrate 201, and then forming the LaB$_6$ film 203 having a film thickness of 5 nm by the apparatus described in FIG. 1, using a magnetron bias sputtering method.

In forming the above LaB$_6$ film 203, the first direct current power supply at −250 volts, and the second direct current power supply at −100 volts were used. Also, for the high frequency power supply 193, a frequency of 13.56 MHz and a power of 800 watts were used.

The magnetic field generating apparatus 102 was set so that when the parallel magnetic field strength on a surface of the substrate 12 (glass substrate 201) (GPalM) and the parallel magnetic field strength on a surface of the target 11 of LaB$_6$ (TPalM) were measured in the magnetic field region 103, (GPalM)/(TPalM)=t was a value in Table 1. For the measurement of the parallel magnetic field strength at this time, "3-Axis and 3-ch Gauss Meter Model 7010" manufactured by TOYO TECHNICA Corporation was used.

For the parallel magnetic field strength on the surface of the substrate 12, the distance between the target 11 and the substrate 12 was changed at 6 points to carry out measurement at 6 measurement points.

For the ratio of wide single-crystal domains to total domains, observation with an electron microscope was carried out for each sample. This result is shown in Table 1.

TABLE 1

| Sample No. | t | Ratio of wide single-crystal domains to all domains |
|---|---|---|
| 1 (Com. Ex. 1) | 0.5 | Wide single-crystal domains were very few, and ratio of narrow |

TABLE 1-continued

| Sample No. | t | Ratio of wide single-crystal domains to all domains |
|---|---|---|
|  |  | single-crystal domains was very large |
| 2 (Com. Ex. 2) | 0.3 | Single-crystal domains were observed to be substantially the same as in Comparative Example 1 |
| 3 (Com. Ex. 3) | 0.2 | Wide single-crystal domains were observed to be about 40%, while narrow single-crystal domains were observed to be 60% |
| 4 (Ex. 1) | 0.1 | Wide single-crystal domains were observed to be about 70%, while narrow single-crystal domains were observed to be 30% |
| 5 (Ex. 2) | 0.08 | Single-crystal domains were observed to be substantially the same as in Example 1 |
| 6 (Ex. 3) | 0.01 | Wide single-crystal domains were observed to be about 90%, while narrow single-crystal domains were observed to be 10%, and uniformity of film quality was very good |

In the electron generating apparatus, a vacuum container was fabricated by the above electron source substrate 208, the phosphor substrate 210 with the anode electrode 205, and a seal member having a thickness of 2 mm (not shown), and the anode electrode 205 and the cathode electrode 202 were connected to a 500-volt direct current power supply 211.

In Table 1, the electron generating apparatuses using the LaB$_6$ electron sources fabricated under the conditions of Examples 1 to 3 corresponding to the samples of the present invention had very high brightness, while Comparative Examples 1 to 3 had low brightness.

Figure 5:
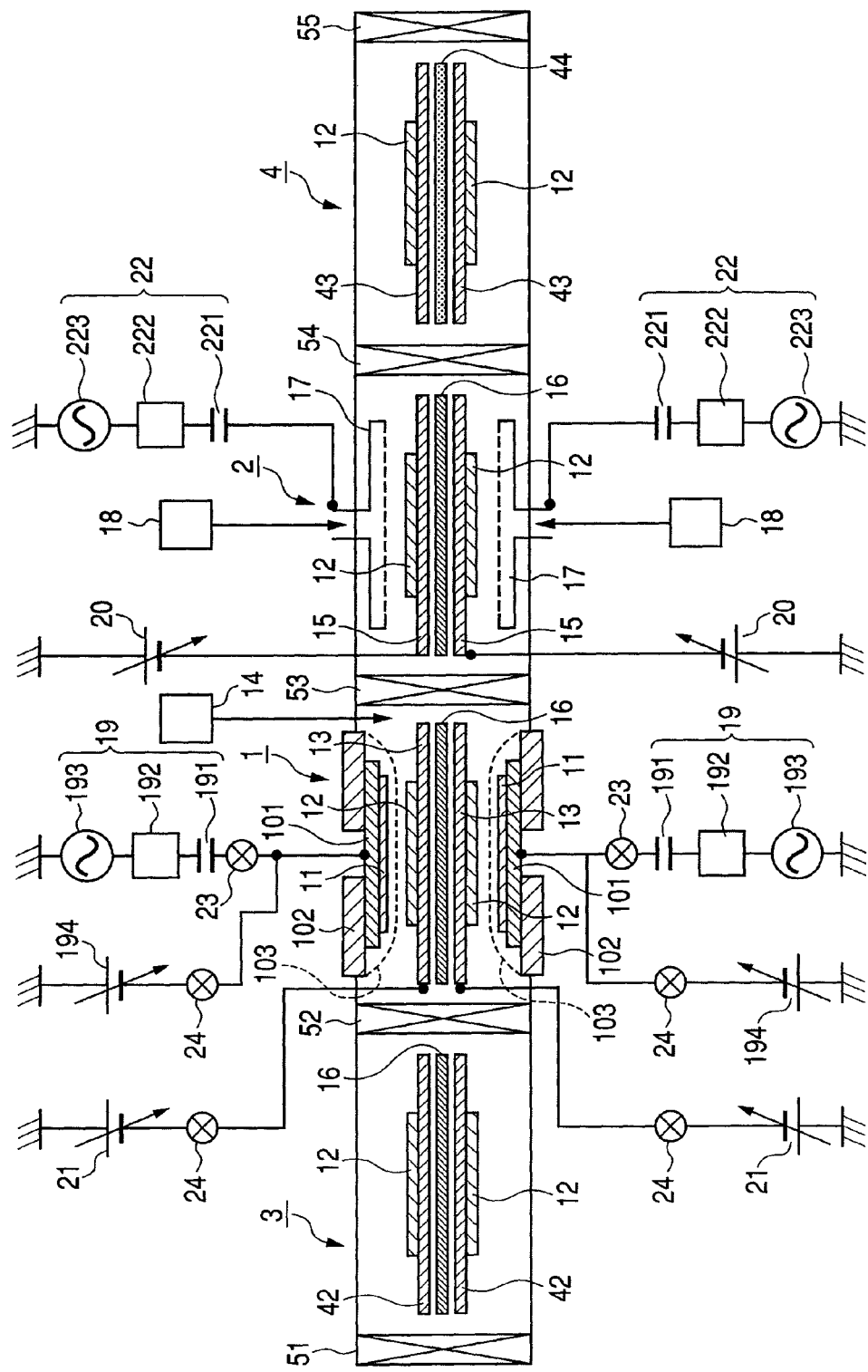
FIG. 5 is a cross-sectional view of a vertical type in-line magnetron sputtering apparatus showing the second embodiment of the present invention.

FIG. 5 shows an example of a vertical type in-line sputtering apparatus according to the second embodiment of the present invention and is a cross-sectional view of the apparatus as seen from above. The same reference numerals as in FIG. 1 denote the same members.

Two substrates 12 are fixed to two substrate holders 42 respectively, conveyed with the substrate holders 42 from the air side to a preparation chamber 3 via a gate valve 51, and subjected to subsequent treatments.

When trays (not shown) are conveyed into the preparation chamber 3, the gate valve 51 closes, and the inside is evacuated by an evacuation system not shown. When the inside is evacuated to a predetermined pressure or less, a gate valve 52 between the preparation chamber 3 and a first container 1 opens, and the trays are conveyed into the first container 1, then, the gate valve 52 is closed again. Subsequently, a LaB$_6$ thin film is formed (deposited) by a procedure similar to that shown in the first embodiment, and then, the evacuation of the sputtering gas is performed by a procedure similar to that shown in the first embodiment. After the evacuation is performed to a predetermined pressure, a gate valve 53 between the first container 1 and a second container 2 is opened, and the trays are conveyed into the second container 2. In the second container 2, a heating mechanism 16 kept at a predetermined temperature is located, and the substrates 12 together with the substrate holders 15 can be subjected to an annealing treatment. At this time, electrons, ions, radicals, or the like may be used, as in the embodiment shown in FIG. 1. After the annealing is completed, the inside is evacuated, then, a gate valve 54 between the second container 2 and a take-out chamber 4 is opened, the trays are conveyed into the take-out chamber 4, and the substrates 12 are fixed to substrate holders 43. The gate valve 54 is closed again. In the take-out chamber 4, a cooling panel 44 for lowering the substrate temperature after annealing is located, and after the temperature drops to a predetermined temperature, the inside of the take-out chamber 4 is returned to atmospheric pressure by a leak gas (a helium gas, a nitrogen gas, a hydrogen gas, an argon gas, or the like), a gate valve 55 is opened, and the trays are taken out to the air side.

In this example, in the first container 1 and the second container 2, the treatments are performed with the trays stopped, but these treatments may be performed while the trays are moved. In this case, for the purpose of balancing with a higher treatment speed of the entire apparatus, the first container 1 and the second container 2 may be appropriately added.

Also, here, the method simultaneously using both high frequency power and direct current power is shown as a magnetron sputtering method, but magnetron sputtering by the first direct current power supply 194 without high frequency application may be performed, depending on the required film quality. In this case, the high frequency power supply 193 and the matching circuit 192 are unnecessary, so that there is an advantage that the apparatus cost can be reduced.

Figure 6:
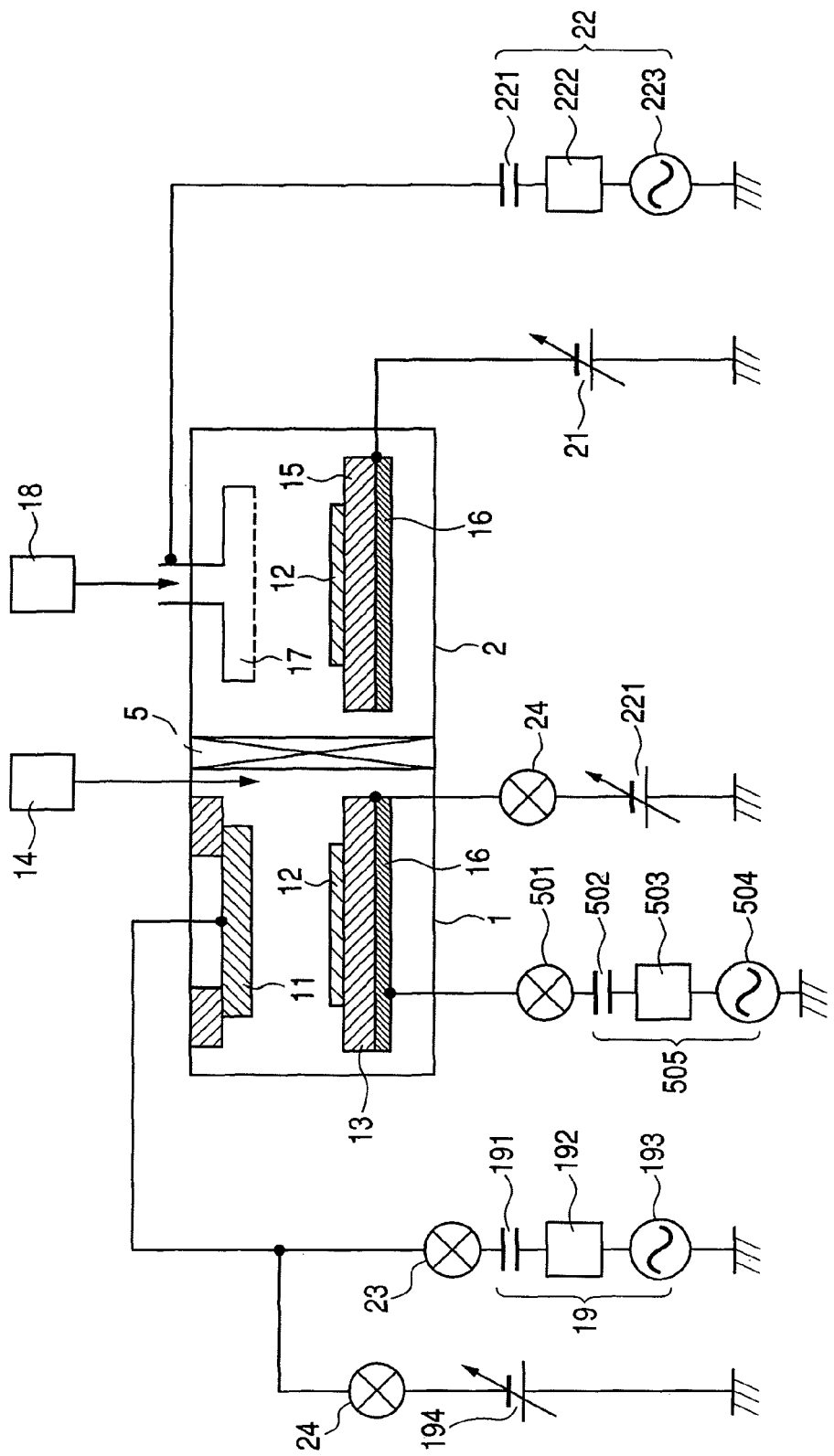
FIG. 6 is a cross-sectional view of a magnetron sputtering apparatus showing the third embodiment of the present invention.

FIG. 6 is a schematic view of an apparatus according to the third embodiment of the present invention. In the apparatus in this embodiment, a high frequency power supply system for a substrate 505 is further mounted in the apparatus shown in FIG. 1. The high frequency power supply system for a substrate 505 is used to apply high frequency power to the substrate 12 via the substrate holder 13.

The high frequency power supply system for sputtering 19 in this embodiment comprises the blocking capacitor 191, the matching circuit 192, and the high frequency power supply (first high frequency power supply) 193, as in the apparatus shown in FIG. 1. Also, the filter (first filter) 23 that cuts low frequency components from the high frequency power supply 193 is connected to the high frequency power supply system for sputtering 19.

The high frequency power supply system for a substrate 505 added in this embodiment comprises a blocking capacitor 502, a matching circuit 503, and a high frequency power supply (second high frequency power supply) 504. Also, a filter (second filter) 501 that cuts low frequency components from the high frequency power supply 504 is connected to the high frequency power supply system for a substrate 505.

The high frequency power supply system for a substrate 505 can output high frequency power (the frequency is 0.1 MHz to 10 GHz, preferably 1 MHz to 5 GHz, and the input power is 100 watts to 3000 watts, preferably 200 watts to 2000 watts) from the high frequency power supply 504, and apply the high frequency power to the substrate 12 via the blocking capacitor 502, the matching circuit 503, and the filter 501 for cutting low frequency components from the high frequency power supply 504. At this time, the use of the filter 501 can also be omitted.

An electron generating apparatus made using the apparatus shown in FIG. 6 can achieve brightness far exceeding the phosphor brightness achieved by the above first embodiment.

Also, in the present invention, for the magnet units used in magnetron sputtering, generally used permanent magnets can be used.

Also, when magnetron sputtering with the movement of the above tray stopped is performed, good film thickness uniformity and a high target utilization rate can be obtained by preparing a target having a slightly larger area than the substrate 12, locating a plurality of magnet units on the back surface of the target at suitable intervals, and translating these in the direction parallel to the target surface. Also, when sputtering is performed while the tray is moved, for the direction of the movement of the substrate, a target and magnet units which have a shorter width than the length of the substrate can be used.

While the preferable embodiments and examples of this application have been described with reference to the accompanying drawings, the present invention is not limited to such embodiments and examples and can be changed into various forms in a technical range understood from the claims.

What is claimed is:

1. A magnetron sputtering apparatus comprising:
    a substrate holder that can hold a substrate;
    a magnetron cathode having a cathode on which a target can be mounted, and a magnetic field generating apparatus;
    a high frequency power supply that applies high frequency power to the target;
    a first direct current power supply that applies direct current power to the target;
    a blocking capacitor placed between the high frequency power supply and the target;
    a low frequency cut filter placed between the blocking capacitor and the target, the low frequency cut filter cutting low frequency components of 0.01 MHz or less from the high frequency power supply so as to enlarge single-crystal domains, wherein one end of the low frequency cut filter is connected to the blocking capacitor and the other end of the low frequency cut filter is connected to the target; and
    a second direct current power supply that applies direct current power to the substrate holder,
    wherein parallel magnetic field strength (in gauss) on a surface of the substrate is set to 0.1 times or less parallel magnetic field strength (in gauss) on a surface of the target, and
    the parallel magnetic field strength on the surface of the target is set to 200 gauss or more and 1000 gauss or less.

2. The magnetron sputtering apparatus according to claim 1, wherein the target contains a lanthanide compound containing at least one element selected from light elements and at least one element selected from lanthanide elements.

3. The magnetron sputtering apparatus according to claim 2, wherein the light element is at least one selected from the group consisting of lithium, beryllium, boron, carbon, fluorine, sodium, magnesium, phosphorus, and sulfur.

4. The magnetron sputtering apparatus according to claim 1, wherein the parallel magnetic field strength on the surface of the substrate is set to 20 gauss or less.

5. The magnetron sputtering apparatus according to claim 1, wherein the parallel magnetic field strength on the surface of the substrate is set to 0.01 times or less parallel magnetic field strength on a surface of the target.

6. The magnetron sputtering apparatus according to claim 1, further comprising a heating mechanism that performs annealing to the substrate after a film deposition.

7. The method for manufacturing a thin film, comprising a step of depositing a lanthanide compound film on a substrate, wherein the magnetron sputtering apparatus according to claim 1 is used.

8. The method for manufacturing a thin film according to claim 7, wherein the target contains a lanthanide compound containing at least one element selected from light elements and at least one element selected from lanthanide elements, and the light element is at least one selected from the group consisting of lithium, beryllium, boron, carbon, fluorine, sodium, magnesium, phosphorus, and sulfur.

* * * * *